United States Patent [19]

Dohmstreich et al.

[11] Patent Number: 5,032,974
[45] Date of Patent: Jul. 16, 1991

[54] THREE-PHASE ALTERNATING CURRENT CIRCUIT CONFIGURATION, FOR USING A POWER SUPPLY FOR THE SYNCHRONIZED TIMING FOR AN ELECTRICAL APPARATUS

[75] Inventors: Wolfgang Dohmstreich, Lauf; Guenter Steinmueller, Nuernberg, both of Fed. Rep. of Germany

[73] Assignee: Siemens Aktiengesellschaft, Berlin & Munich, Fed. Rep. of Germany

[21] Appl. No.: 444,690

[22] Filed: Dec. 1, 1989

[30] Foreign Application Priority Data

Dec. 15, 1988 [EP] European Pat. Off. ........ 88121012.4

[51] Int. Cl.$^5$ ............................................. H02M 5/00
[52] U.S. Cl. ..................................... 363/148; 363/95
[58] Field of Search .................... 363/3, 148; 323/902

[56] References Cited

U.S. PATENT DOCUMENTS 3,968,418  7/1976  Kain et al. .
4,081,746  3/1978  Snyder et al. ........................ 324/116
4,791,546 12/1988  Carroll ................................. 363/95

FOREIGN PATENT DOCUMENTS 0464218 12/1974  Australia .
0668811  8/1963  Canada ................................ 363/148
2446602  9/1978  Fed. Rep. of Germany .
2605803 11/1978  Fed. Rep. of Germany .
2834881  2/1980  Fed. Rep. of Germany .
3719439 12/1988  Fed. Rep. of Germany .

OTHER PUBLICATIONS

General Electric Company, Transistor Manual, 8/64 pp. 178-179.
Funkschau, vol. 16, 1985, pp. 53-54, Francis Verlag, Muenchen, "Grundschaltungen der Elektronik, Optokoppler, G8, Teil 1".

Primary Examiner—Steven L. Stephan
Assistant Examiner—Kristine Peckman
Attorney, Agent, or Firm—Kenyon & Kenyon

[57] ABSTRACT

A three-phase circuit configuration for the synchronized timing of an electrical apparatus with the three phase power supply where the timing clock pulses are formed from a control voltage. In a four wire configuration, the control voltage is the voltage between a neutral point formed by three unequal resistors and the neutral line. In a three wire configuration, an additional neutral point is formed by coupling together another set of three resistors. The control voltage for the three wire configuration is the voltage between the two neutral points.

8 Claims, 1 Drawing Sheet

THREE-PHASE ALTERNATING CURRENT CIRCUIT CONFIGURATION, FOR USING A POWER SUPPLY FOR THE SYNCHRONIZED TIMING FOR AN ELECTRICAL APPARATUS

FIELD OF THE INVENTION

The invention relates to a three-phase circuit configuration for synchronizing the timing of an electrical apparatus and more particularly to a three-phase circuit configuration where the three phase power supply is used to produce the timing signal for an electrical apparatus.

BACKGROUND OF THE INVENTION

An example of the type of apparatus to which the present invention relates is an electricity rate meter, as described in German patent No. 24 46 602. An electricity rate meter is used for the continuous recording and display of the electrical energy consumption. These electrical energy consumption values are averaged over constant time intervals. Such apparatus is frequently operated with three-phase power supplied by a three-phase power supply unit. In such apparatus, pulses are generated according to the measured electrical power, and these pulses are stored for a specified period of time. The pulses are calculated from the integral of the measured electrical power versus time and are thus a measure of the consumed electrical energy drawn from the power supply. Pulses of constant frequency, which are derived from the frequency of the power supply, are needed as a time base.

Peak demand detectors also have a similar method of operation as described in German Patent No. 26 05 803. As with rate meters, peak demand detectors are supplied from an assigned power system and derive clock pulses for their time basis from this power supply.

An a.c. control voltage suitable for the formation of pulses can be derived from a three-phase power supply. In the case of a four-wire configuration, an a.c. control voltage is usually obtained from a phase voltage, that is, from the voltage between a phase line and the neutral line. In a three-wire configuration a line to line voltage serves this purpose. As a result, if the phase that is used for the a.c. control voltage fails, clock pulses will cease to occur even though the apparatus is still sufficiently supplied with current. Thus, the entire apparatus does not function properly during the failure of the respective phase voltage.

There is a need to maintain the operation of an apparatus driven by three-phase power, even when failure occurs in one or two phases of the three-phase power. In other words clock pulses need to be continuously generated as long as the apparatus remains in operation with a sufficient power supply.

SUMMARY OF THE INVENTION

These and other needs are satisfied by the configuration of the present invention for the synchronized timing of a power supply for an electrical apparatus. In a three-phase power supply with four wires, the wires are coupled to three large star connected resistors having different resistance values. These resistors are coupled to the phase conductors of the three-phase power supply and are also coupled together to form an electrically asymmetrical neutral point opposite the neutral line. If the three-phase power supply has a three wire connection, the leads of the three-phase power supply are coupled to two sets of three star coupled resistors having different resistance values. The ends of each set of resistors are coupled together to form two neutral points which are electrically asymmetrical to each other because of the selection of resistors having different resistance values of the assigned resistors. In a four wire connection the clock pulses are formed from the a.c. control voltage arising between the neutral point and the neutral line. In a three wire connection the clock pulses are formed from the a.c. control voltage arising between the first and second neutral points. In accordance with another feature of the invention, a Schmitt trigger can be used to generate pulses from the alternating current control voltage. In accordance with a further feature of the present invention, the pulse generator contains an optical coupler that electrically isolates the electrical apparatus from the power system.

DETAILED DESCRIPTION

Figure 1:
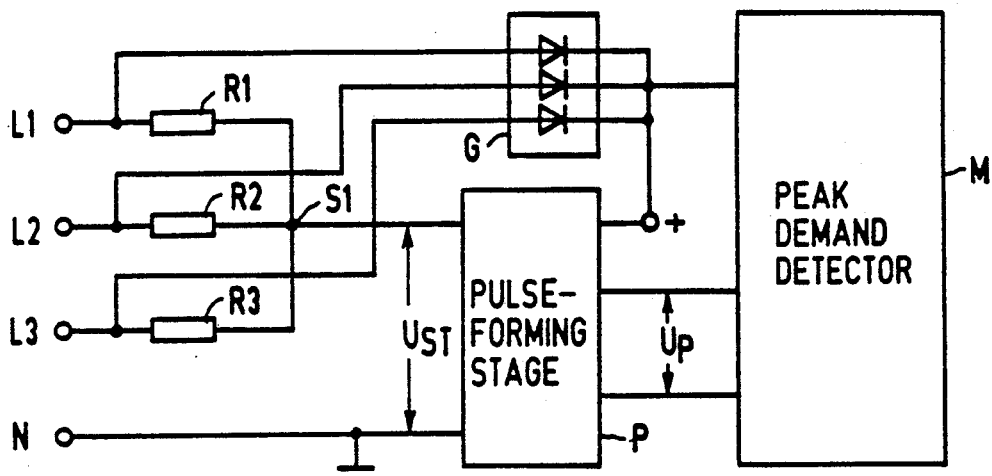
FIG. 1 is a block diagram of the circuit configuration in a four-wire configuration according to an embodiment of the invention.

Referring to FIG. 1, the phase connections L1, L2 and L3 and the neutral line N of a four-wire, three-phase power supply are shown. The phase leads L1, L2, and L3 are coupled to a common neutral point S1 across respective resistors $R_1$, $R_2$, and $R_3$, having different resistance values (asymmetrical resistors). The voltage between this neutral point S1 and the neutral line is an a.c. control voltage $U_{ST}$ which is supplied to a pulse-forming stage P. With a stable a.c. voltage, the amplitude of the a.c. control voltage $U_{ST}$ depends on the differential values of the resistors $R_1$, $R_2$, and $R_3$. The pulse-forming stage P converts this a.c. control voltage $U_{ST}$ to a pulse sequence $U_P$. The pulse sequence $U_P$ is fed to the electrical apparatus M as a time base. The electrical apparatus M can be a peak demand detector, for example.

The electrical d.c. voltage required for supplying the pulse-forming stage P and the electrical apparatus M is obtained from the three-phase power supply L1, L2 L3 by rectifying the phase voltages in a three-phase rectifier G.

In comparison with deriving the a.c. control voltage $U_{ST}$ from one of the three phases of the three-phase leads L1, L2, L3, the tapping of the a.c. control voltage $U_{ST}$ between the neutral point S1, which is coupled to the asymmetrical resistors $R_1$, $R_2$, and $R_3$, and the neutral line N has the advantage that the a.c. control voltage $U_{ST}$ is continuously produced even when one or two phases of the three-phase power supply have failed.

The same is true for the d.c. supply voltage obtained from all three phases. The d.c. supply voltage is continuously produced so that the electrical apparatus M still continues to operate even when individual phases fail. If the three-phase power supply undergoes a complete failure, the apparatus is no longer able to function.

Figure 2:
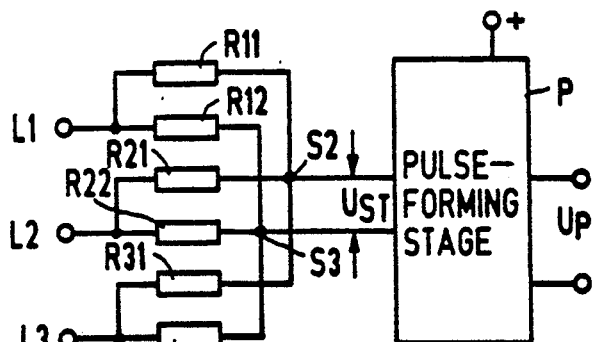
FIG. 2 is a block diagram of the circuit configuration in a three-wire configuration according to an embodiment of the invention.

Referring to FIG. 2, a variation of the circuit configuration of FIG. 1 is shown. This circuit configuration can be used in a three-phase circuit with a three-wire connection, i.e., without a neutral line. Here, the resistors $R_{11}$, $R_{21}$, and $R_{31}$ are coupled to the neutral point S2 and the resistors $R_{12}$, $R_{22}$, and $R_{32}$ are coupled to the neutral point S3. The control voltage $U_{ST}$ is the resulting voltage between the two neutral points S2 and S3. The control voltage $U_{ST}$ is present whenever one neutral point is asymmetrical in relation to the other. One neutral point is asymmetrical in relation to the other whenever the resistors that are coupled to a particular neutral point have different values or whenever corresponding resistors coupled to form both neutral points have different values. The control voltage $U_{ST}$ resulting in this manner is further processed in the configuration described referring to FIG. 1.

Figure 3:
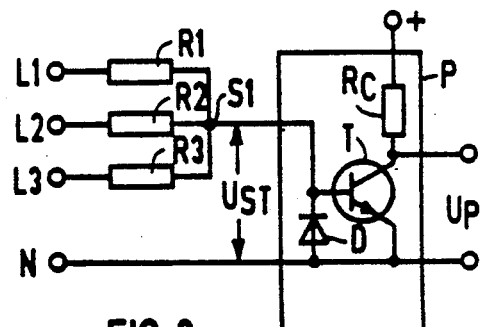
FIG. 3 is a circuit diagram of a device for the extraction of clock pulses from a four-wire configuration according to an embodiment of the invention.

Referring to FIG. 3, a design for the generation of pulses in the pulse-forming stage P is shown. The control voltage $U_{ST}$ is coupled to a half-wave rectifier D, which produces a half-wave voltage signal. This half-wave voltage signal is fed to the base of a switching transistor T, whose collector lead is coupled across a resistor $R_C$ to the positive power supply voltage of the apparatus. Clock pulses arise across the load resistor $R_C$ of the switching transistor corresponding to the appearance half-wave voltage signals across the half-wave rectifier D.

Figure 4:
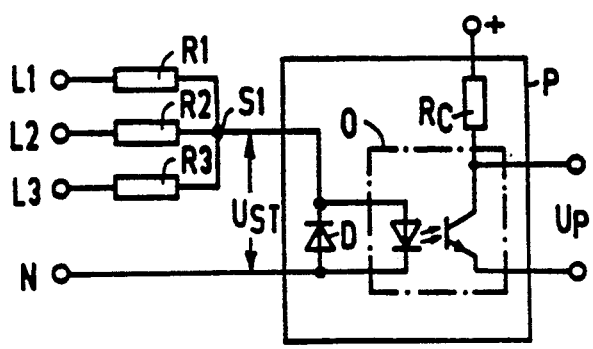
FIG. 4 is a circuit diagram of a device for the extraction of clock pulses from a four-wire configuration with simultaneous electrical isolation according to an embodiment of the invention.

Referring to FIG. 4, another design for the switching circuitry of the pulse forming stage P is shown. The switching transistor T is replaced by an optical coupler O. The optical coupler electrically isolates the pulse-forming stage from the three-phase power supply.

Figure 5:
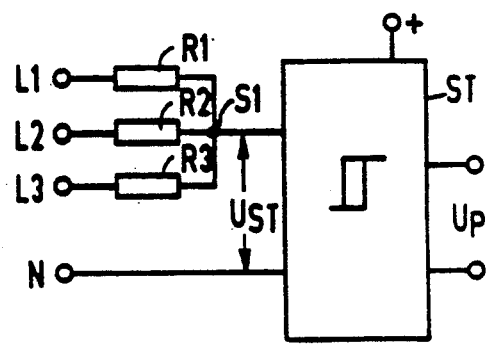
FIG. 5 is a circuit diagram of a device for the extraction of clock pulses from a four-wire configuration with signal conversion according to an embodiment of the invention.

Referring to FIG. 5, the circuit configuration including a Schmitt trigger is shown. A Schmitt trigger ST takes the place of the pulse-forming stage P shown in the switching configurations of FIGS. 3 and 4. These switching variations can be applied so that the clock pulses exhibit a specified form, for example to filter out interference pulses.

What is claimed is:

1. A three-phase circuit configuration for synchronizing the timing of an electrical apparatus having a three-phase supply, wherein each of said phases supplied power and said three-phase supply has a four-wire connection comprising three phase line connections and one neutral line connection, said configuration comprising:
   a resistor network including three resistors having different resistance values, each of said resistors having a first end coupled to one of said three phase line connections, each of said resistors having a second end, whereby all three of said second ends are coupled together to form an electrically asymmetrical neutral point opposite said neutral line so that an a.c. control voltage is generated between said asymmetrical neutral point and said neutral line so long as any one of said three phases is supplying power; and
   a line commutated pulse generator having said control voltage as an input and providing clock pulses as an output.

2. The three-phase alternating current circuit configuration of claim 1, wherein said pulse generator comprises a Schmitt trigger.

3. The three-phase alternating current circuit configuration of claim 2, wherein said pulse generator includes an optical coupler that electrically isolates said control voltage from said pulse generator.

4. The three-phase alternating current circuit configuration of claim 1, wherein said pulse generator includes an optical coupler that electrically isolates said control voltage from said pulse generator.

5. A circuit configuration for synchronizing the timing of an electrical apparatus having a three-phase supply, wherein each of said phases supplies power and said three-phase supply has a three-wire connection comprising three phase line connections, said configuration comprising:
   a resistor network including two sets of three resistors having different resistance values, each of said resistors having a first end coupled to one of said three phase line connections, each of said resistors having a second end, whereby said second ends of the three resistors in each of the sets are coupled together to form an electrically asymmetrical neutral point, thus forming two asymmetrical neutral points, an a.c. control voltage is generated between said asymmetrical neutral points so long as any one of said three phases is supplying power; and
   a line commutated pulse generator having said control voltage as an input and providing clock pulses as an output.

6. The three-phase alternating current circuit configuration of claim 5, wherein said pulse generator comprises a Schmitt trigger.

7. The three-phase alternating current circuit configuration of claim 6, wherein said pulse generator includes an optical coupler that electrically isolates said control voltage from said pulse generator.

8. The three-phase alternating current circuit configuration of claim 5, wherein said pulse generator includes an optical coupler that electrically isolates said control voltage from said pulse generator.

* * * * *